US012720936B2

(12) United States Patent
Lim et al.

(10) Patent No.: US 12,720,936 B2
(45) Date of Patent: Aug. 25, 2026

(54) LEAD FRAME SHEET AND OPTOELECTRONIC SEMICONDUCTOR DEVICE

(71) Applicant: ams-OSRAM International GmbH, Regensburg (DE)

(72) Inventors: Choo Kean Lim, Jalan Tengku (MY); Ismail Ithnain, Penang (MY); Wei Lyn Eunice Kwok, Pulau Pinang (MY); Wing Yew Wong, Penang (MY); Heng Keong Yip, Selangor (MY); Zulhafiz Zulkifli, Penang (MY)

(73) Assignee: ams-OSRAM International GmbH, Regensburg (DE)

( * ) Notice: Subject to any disclaimer, the term of this patent is extended or adjusted under 35 U.S.C. 154(b) by 445 days.

(21) Appl. No.: 18/572,709

(22) PCT Filed: Jun. 30, 2021

(86) PCT No.: PCT/EP2021/067974
§ 371 (c)(1),
(2) Date: Dec. 20, 2023

(87) PCT Pub. No.: WO2023/274520
PCT Pub. Date: Jan. 5, 2023

(65) Prior Publication Data

US 2024/0290696 A1 Aug. 29, 2024

(51) Int. Cl.
*H10H 20/857* (2025.01)
*H10H 29/85* (2025.01)
(Continued)

(52) U.S. Cl.
CPC ........ *H10H 20/857* (2025.01); *H10H 29/857* (2025.01); *H10W 70/421* (2026.01); *H10W 74/111* (2026.01)

(58) Field of Classification Search
CPC . H10H 20/857; H10H 29/857; H10W 70/421; H10W 74/111; H10W 90/00
See application file for complete search history.

(56) References Cited

U.S. PATENT DOCUMENTS

2006/0186514 A1* 8/2006 Shim .................... H10W 74/111 257/E25.023
2011/0133232 A1 6/2011 Yoshioka et al.
(Continued)

FOREIGN PATENT DOCUMENTS

DE 102016103354 A1 8/2017
DE 102018101813 A1 8/2019
(Continued)

*Primary Examiner* — Hoai V Pham
(74) *Attorney, Agent, or Firm* — Slater Matsil, LLP

(57) ABSTRACT

In an embodiment a lead frame sheet includes a plurality of device units, each device unit configured for an optoelectronic semiconductor device and having at least two metallic lead frame parts configured for being applied to an electric component at a top side and configured for being soldered onto an external carrier at a bottom side opposite the top side, wherein each one of the lead frame parts includes at least one bottom tie bar connecting adjacent ones of the device units, wherein, at a border line between adjacent ones of the device units, the bottom tie bars form part of the bottom side, and wherein, towards the top side, the bottom tie bars narrow such that each bottom tie bar has a local minimum or a global minimum of a width at the top side and along the border line.

16 Claims, 4 Drawing Sheets

(51) Int. Cl.
*H10W 70/40* (2026.01)
*H10W 74/10* (2026.01)

(56) References Cited

U.S. PATENT DOCUMENTS

| | | | | |
|---|---|---|---|---|
| 2017/0148709 | A1 | 5/2017 | Sakamoto et al. | |
| 2018/0012872 | A1 | 1/2018 | Okui et al. | |
| 2019/0074418 | A1 | 3/2019 | Wittmann et al. | |
| 2020/0131026 | A1* | 4/2020 | Doraisamy | B81B 7/007 |
| 2020/0287111 | A1 | 9/2020 | Schwarz et al. | |
| 2020/0402943 | A1 | 12/2020 | Hien et al. | |

FOREIGN PATENT DOCUMENTS

| | | | |
|---|---|---|---|
| JP | H0529520 | U | 4/1993 |
| JP | 2010056371 | A | 3/2010 |
| JP | 2012182179 | A | 9/2012 |
| JP | 2012253234 | A | 12/2012 |

* cited by examiner 1
24
44
4
41
11a
24
11d
23
3, 51
13
52
Wmin
11c
33, 6
7
11b
11b
14
24
24
11c
11d
21
22
44
4
11a

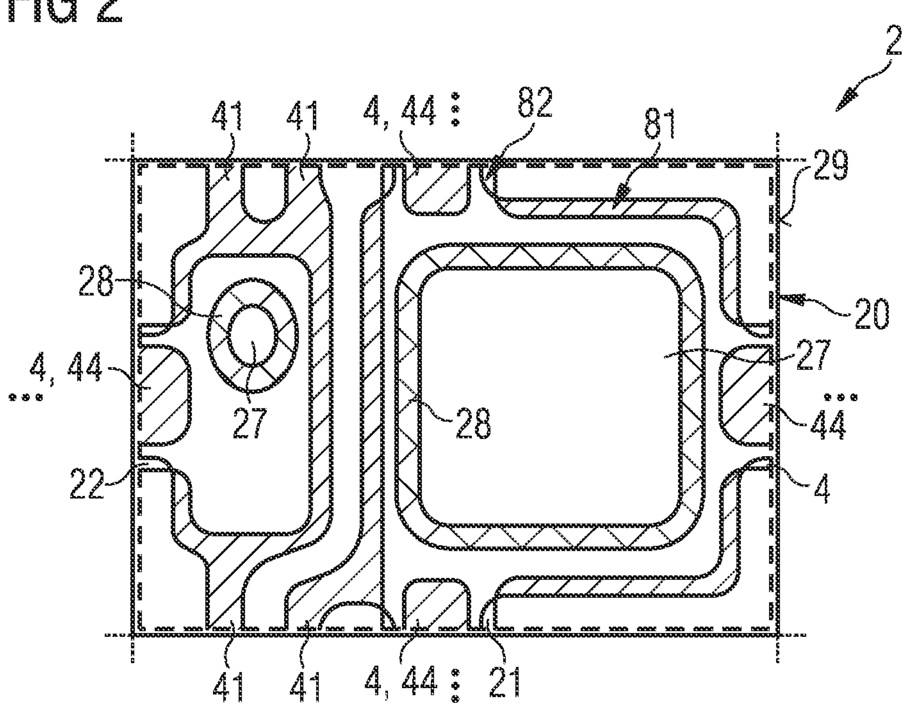
FIG 2
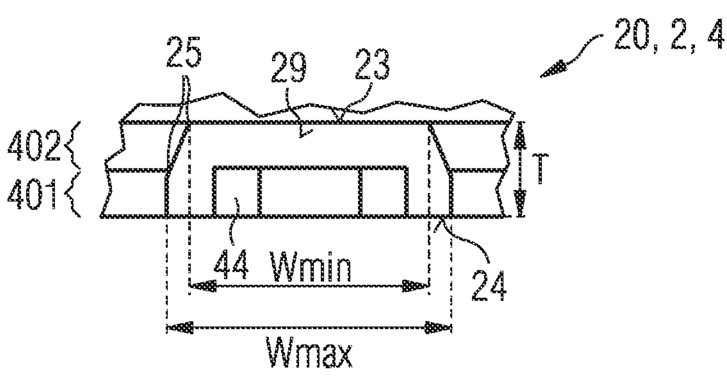
FIG 3
FIG 4
Wmin
23
4
25
29
402
401
44
24
Wmax

LEAD FRAME SHEET AND OPTOELECTRONIC SEMICONDUCTOR DEVICE

CROSS-REFERENCE TO RELATED APPLICATIONS

This patent application is a national phase filing under section 371 of PCT/EP2021/067974/, filed Jun. 30, 2021, which is incorporated herein by reference in its entirety.

TECHNICAL FIELD

A lead frame sheet and an optoelectronic semiconductor device are provided.

SUMMARY

Embodiments provide an optoelectronic semiconductor device that has a reduced risk for cracks in a package body.

According to at least one embodiment, the lead frame sheet comprises a plurality of device units. All the device units may be of identical design, or device units of different designs may be present in the lead frame sheet. For example, the lead frame sheet comprises at least eight or at least 16 or at least 32 of the device units. Alternatively or additionally, the lead frame sheet comprises at most 160000 or at most 12000 or at most 1000 of the device units.

According to at least one embodiment, each one of the device units is configured for an optoelectronic semiconductor device. Between adjacent device units, there may be a separation line configured, for example, for sawing or laser cutting. Hence, the lead frame sheet is configured to be singulated and cut between adjacent device units, in particular after forming a package body at the device units.

According to at least one embodiment, each device unit comprises at least two metallic lead frame parts. For example, the lead frame parts and consequently the lead frame sheet are made of copper or a copper alloy. A bottom side and/or an opposite top side of the lead frame parts may be provided in places or completely with at least one coating to adjust optical properties of the lead frame parts or to improve handling of the lead frame parts. For example, there can be at least one coating to improve soldering of the lead frame parts.

According to at least one embodiment, the lead frame parts are configured for being applied with electric components at the top side. Such electric components are, for example, semiconductor chips like light-emitting diodes, LEDs for short, laser diodes, LDs for short, photo diodes, temperature sensors, integrated circuits, ICs for short, or also electric connection means like bond wires. It is possible that each one of the lead frame parts is configured for a corresponding at least one electric component. However, there can be additional lead frame parts that are free of any electric component.

According to at least one embodiment, the lead frame parts are configured for being soldered onto an external carrier at the bottom side which is opposite the top side. The external carrier is, for example, a circuit board like a printed circuit board.

According to at least one embodiment, some or all of the lead frame parts comprise one or a plurality of bottom tie bars. The at least one bottom tie bar per lead frame part mechanically connects adjacent ones of the device units. Hence, by means of the bottom tie bars the lead frame sheet could mechanically be one unit that may easily be handled.

According to at least one embodiment, at a border line between adjacent ones of the device units, the bottom tie bars form part of the bottom side. In particular, the border line corresponds to the separation lines. In other words, the bottom tie bars are affected by the singulating of the lead frame sheet, and at the singulation lines, the bottom tie bars are located at the bottom side.

According to at least one embodiment, towards the top side, the bottom tie bars narrow such that the bottom tie bars each have a local minimum or a global minimum of a width at the top side or next to the top side and, seen in top view, along the border line. In other words, at the top side and along the singulation lines, there is an overall narrowest portion of the bottom tie bars, or there is an at least locally narrowest portion of the bottom tie bars. For example, lateral sides of the bottom tie bars run in an inwardly inclined manner towards the top side. These lateral sides are oriented obliquely, for example, perpendicular to the border line.

In at least one embodiment, the lead frame sheet comprises a plurality of device units, each one of the device units being configured for an optoelectronic semiconductor device, wherein:

- each device unit comprises at least two metallic lead frame parts configured for being applied with an electric component at a top side and configured for being soldered onto an external carrier at a bottom side opposite the top side,
- each one of the lead frame parts comprises at least one bottom tie bar connecting adjacent ones of the device units,
- at a border line between adjacent ones of the device units, the bottom tie bars form part of the bottom side, and
- towards the top side, the bottom tie bars narrow such that the bottom tie bars each have a local minimum or a global minimum of a width at the top side and along the border line.

In particular after thermal stress due to a soldering process, corners of typically rectangularly shaped lead frame parts may increase the risk for cracks in a package body. By means of the, for example, trapezium shaped bottom tie bars, seen in cross-section along the border line, the risk for cracks to occur can be reduced.

Further, the bottom tie bar design described herein requires only minor adaptions of a manufacturing process of optoelectronic semiconductor devices based on the described lead frame sheets, and thus this concept can be applied in a fast and easy manner. Moreover, thinner package walls can be realized because the package walls only need to have reduced resilience against the effects of cracks.

An optoelectronic semiconductor device is additionally provided. The optoelectronic semiconductor device is produced based on the lead frame sheet as described in connection with at least one of the above-stated embodiments. Features of the optoelectronic semiconductor device are therefore also disclosed for the lead frame sheet and vice versa.

In at least one embodiment, the optoelectronic semiconductor device comprises:

- at least two metallic lead frame parts, and
- a package body made of at least one plastic material and mechanically connecting the at least two lead frame parts, wherein

- each one of the lead frame parts comprises a bottom tie bar extending to a side face of the semiconductor device, and at the side face the bottom tie bars form part of a bottom face of the semiconductor device, each one of the lead frame parts is for an electric component at a top side and for an external carrier at a bottom side opposite the top side, the bottom side (24) being part of the bottom face, towards the top side, the bottom tie bars narrow such that the bottom tie bars each have a local minimum or a global minimum of a width at the top side and at the side face.

According to at least one embodiment, seen in plan view of the respective side face, the top side of each one of the bottom tie bars has rounded ends. Hence, there is no sharp corner at the ends of the top side within the side face. For example, a minimum radius of a corresponding rounding is at least 20 μm or is at least 40 μm or, preferably, is at least 70 μm. As an option, in a direction perpendicular to the top side, the rounding may stretch over at least 2% or at least 5% or at least 10% of a thickness of the respective bottom tie bar. That is, seen in side view of the respective bottom tie bar, the rounding may extend along the thickness direction for at least 2% or at least 5% or at least 10% of the thickness of the respective bottom tie bar, starting from the top side.

According to at least one embodiment, the package body is thicker than the lead frame parts. For example, a thickness of the package body exceeds a thickness of the lead frame parts by at least a factor of two or by at least a factor of four and/or by at most a factor of 20. Hence, the package body is significantly thicker than the lead frame parts.

According to at least one embodiment, the bottom face of the lead frame parts is configured for surface mount technology, SMT for short. Thus, the optoelectronic semiconductor device can be an SMT device.

According to at least one embodiment, seen in plan view of the respective side face, the bottom tie bars are completely or partially of trapezoidal shape. This may apply to an average or to an actual geometry of the respective bottom tie bar. In particular, because of manufacturing the bottom tie bars, for example, by etching, the lateral sides of the bottom tie bars may have various roundings and/or curvatures and/or a wrinkling, but when averaged over these roundings and/or curvatures and/or wrinkling, the bottom tie bar is of trapezoidal shape.

According to at least one embodiment, the lead frame parts are etched both from the bottom side and from the top side. Hence, a contour or silhouette of the top side may deviate from a contour or silhouette of the bottom side. The etchings from the top side and from the bottom side may have the same or also may have different depths.

According to at least one embodiment, seen in plan view of the respective side face, the bottom tie bars comprise a first, broader region next to the bottom side and a second, narrower region next to the top side. It is possible that, seen in plan view of the respective side face, the associated bottom tie bar consists of the first region and of the second region.

According to at least one embodiment, in the second region the tie bars have inclined lateral sides, in particular inwardly inclined lateral sides. Thus, in the second region the respective bottom tie bar can be shaped like a trapezoid.

According to at least one embodiment, a global maximum width of the bottom tie bars is in the first region. For example, the first region may be of rectangular or of approximately rectangular shape.

According to at least one embodiment, seen in plan view of the respective side face, the second region continuously narrows towards the top side so that the bottom tie bars each have the global minimum of their width at the top side and at the side face. In other words, at the side face the narrowest portion of the respective bottom tie bar, in a direction parallel to the top side, is the top side.

According to at least one embodiment, seen in plan view of the respective side face, the bottom tie bars comprise a third, narrower region next to the bottom side and a fourth, broader region next to the top side. In this case, the bottom tie bars may also comprise a further region directly at the top side and, thus, between the top side and the fourth region. In the further region, the roundings at the ends of the top side, in the plane of the side face, may be located. Otherwise, seen in plan view of the respective side face, it is possible that the associated bottom tie bar consists of the third region and of the fourth region.

The first, second, third and fourth regions may be defined by the etchings from the bottom side and from the top side.

According to at least one embodiment, a global maximum width of the bottom tie bars is in the fourth region, seen in plan view of the respective side face, so that towards the top side the bottom tie bars each may have not the global, but the local minimum of their width at the top side. In other words, the bottom tie bar, seen in plan view of the respective side face, can be narrower than or as narrow as at the top side in places, for example, at the bottom side.

According to at least one embodiment, the bottom tie bars each comprise a control window at the side face. For example, the control windows are free of a material of the respective lead frame part. In other words, the control windows can be recesses in the bottom tie bars. By means of the control windows, correctness of a soldering of the optoelectronic semiconductor device onto an external carrier may be checked.

According to at least one embodiment, the control windows each reach to the bottom face of the optoelectronic semiconductor device. That is, by means of the respective control window, there is a recess in the bottom face and, thus, in the bottom side of the respective lead frame part.

According to at least one embodiment, seen in plan view of the respective side face, at the bottom face and, thus, at the bottom side the control windows are in each case located between two sections of the associated bottom tie bar. For example, the associated bottom tie bar forms a U around the respective control window, seen in plan view of the bottom face.

According to at least one embodiment, the control windows are located in the first region or in the third region, respectively. As an option, a height of the control windows corresponds to a thickness of the first region or of the third region, respectively. The latter applies, for example, with a tolerance of at most 20% or of at most 10% or of at most 5% of an overall thickness of the lead frame parts.

According to at least one embodiment, along a direction perpendicular to the respective side face, a length of the control windows is at least 3% or is at least 5% of an extent of the semiconductor device along the respective direction. Alternatively or additionally, said extent is at most 30% or is at most 20% or is at most 10% of said extent.

According to at least one embodiment, seen in plan view of the respective side face, the bottom tie bars each comprise an axis of mirror symmetry. For example, said axis of mirror symmetry runs perpendicular to the bottom side.

According to at least one embodiment, also seen in plan view of the respective side face, for a ratio of the width Wt of the bottom tie bars at the top side and the maximum width Wmax of the bottom tie bars in each case the following applies: $0.60 \leq Wt/Wmax \leq 0.90$ or $0.70 \leq Wt/Wmax \leq 0.85$ or $0.73 \leq Wt/Wmax \leq 0.81$. This is particularly true for trapezoidal bottom tie bars, seen in plan view of the respective side face.

According to at least one embodiment, for a ratio of the maximum width Wmax and a thickness Tmax of the lead frame parts the following applies: $1.2 \leq Wmax/Tmax \leq 6.0$ or $1.5 \leq Wmax/Tmax \leq 4.0$ or $1.7 \leq Wmax/Tmax \leq 3.0$.

The numerical values in the two preceding paragraphs may apply to all bottom tie bars and lead frame parts or only to some or to one of the bottom tie bars and lead frame parts.

According to at least one embodiment, the bottom tie bars continuously narrow towards the top side and until the top side by at least 3% or by at least 5% or by at least 10% or by at least 20% of a maximum thickness of the respective bottom tie bar at the respective side face. Hence, the term 'local minimum' is valid at least for said thickness proportions.

According to at least one embodiment, the optoelectronic semiconductor device further comprises one or a plurality of supporting tie bars. The at least one supporting tie bar also extends to the respective side face. That is, both the bottom tie bars and the supporting tie bars are exposed at the respective side face and form part of said side face.

According to at least one embodiment, seen in plan view of the respective side face, the supporting tie bars are in each case completely surrounded by the package body. Hence, the supporting tie bars do not form part of the bottom side, but may form part of the top side of the lead frame parts.

It is possible that all of the lead frame parts each comprise one or a plurality of the supporting tie bars, or only some of the lead frame parts are provided with the supporting tie bars.

According to at least one embodiment, the package body forms a cavity. Thus, the top side of the lead frame parts is partially free of the package body or may also be completely covered by the package body. The latter may in particular apply for translucent package bodies.

According to at least one embodiment, the optoelectronic semiconductor device further comprises, as the electric components, one or a plurality of optoelectronic semiconductor chips and one or a plurality of electric connection means like bond wires. For example, the optoelectronic semiconductor device is an LED device.

According to at least one embodiment, at least one groove is formed around the electric components in the respective lead frame part. The grooves in the top side may serve as stop edges for so-called mold flash. Thus, by means of the grooves it may be avoided that a material of the package body contaminates lands for the electric components. A depth of the grooves may correspond to a depth of the semi-etching from the top side. The bottom side may be free of any such grooves.

An optoelectronic semiconductor device and a lead frame sheet are explained in greater detail below by way of exemplary embodiments with reference to the drawings. Elements which are the same in the individual figures are indicated with the same reference numerals. The relationships between the elements are not shown to scale, however, but rather individual elements may be shown exaggeratedly large to assist in understanding.

BRIEF DESCRIPTION OF THE DRAWINGS

FIG. 2 shows is a schematic top view of an exemplary embodiment of a lead frame sheet for optoelectronic semiconductor devices described herein;

FIG. 3 shows is a schematic side view of a bottom tie bar of the lead frame sheet of FIG. 2;

FIG. 4 shows is a schematic side view of an exemplary embodiment of a bottom tie bar for optoelectronic semiconductor devices described herein;

DETAILED DESCRIPTION OF ILLUSTRATIVE EMBODIMENTS

Figure 1:
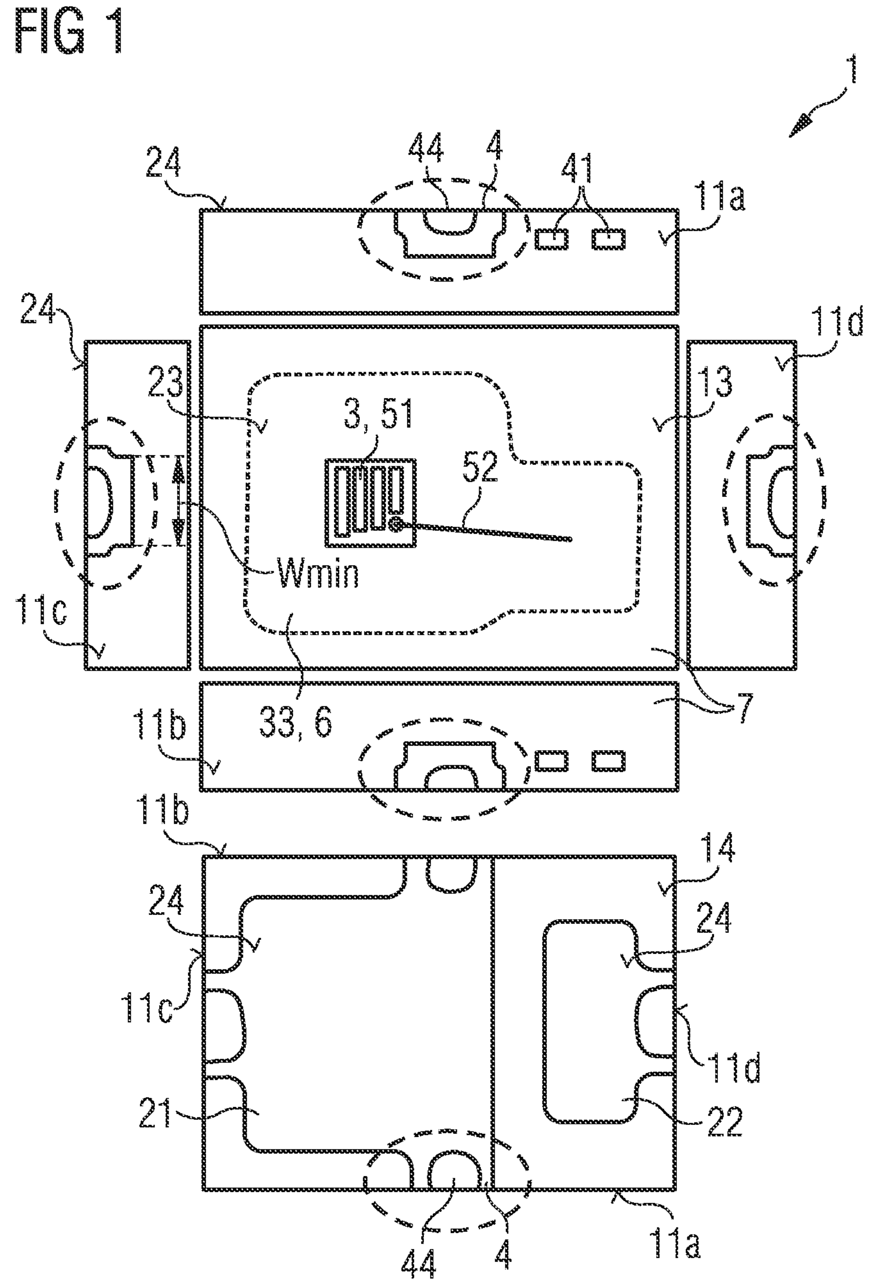
FIG. 1 shows is a schematic six-plane projection of an exemplary embodiment of an optoelectronic semiconductor device described herein

FIG. 1 illustrates an exemplary embodiment of an optoelectronic semiconductor device 1. In the upper part of FIG. 1, a top view and four side views of the four respective sides of the centrally arranged top view are illustrated. In the lower part of FIG. 1 there is a bottom view.

The semiconductor device 1 comprises a first lead frame part 21 and a second, smaller lead frame part 22. Both lead frame parts 21, 22 are, for example, based on copper or based on a copper alloy. At a top side 23 of the first lead frame part 21, there is an optoelectronic semiconductor chip 51 as a first electric component. At a top side 23 of the second lead frame part 22, there is a bond wire 52 as a second electric component. By means of the bond wire 52 and the first lead frame part 21, the optoelectronic semiconductor chip 51 which is, for example, an LED chip, is electrically connected. Unlike shown in FIG. 1, there can be more than one optoelectronic semiconductor chip 51 and there can be more than two lead frame parts 21, 22; the same applies to all other exemplary embodiments.

Further, the semiconductor device 1 includes a package body 7. For example, the package body 7 is made from a white plastic material, which may be a silicone or epoxy filled with reflective particles like $TiO_2$ particles. By means of the package body 7, the lead frame parts 21, 22 are mechanically connected to each other. The optoelectronic semiconductor chip 51 and the bond wire 52 may be arranged at a distance from the package body 7 so that the package body 7 does not touch the electric components 51, 52.

As an option, the package body 7 forms a cavity 33 into a top face 13 in which the optoelectronic semiconductor chip 51 and the bond wire 52 are arranged. Optionally, the cavity 33 is partially or completely filled with a filling material 6. The filling material may be made of a silicone material. For example, the filling material 6 is transparent for a radiation emitted by the at least one optoelectronic semiconductor chip 51.

As a further option, the filling material 6 may contain at least one additive to change an emission spectrum of the optoelectronic semiconductor chip 51. Such an additive could be an optical filter material and particularly at least one luminescent material, like an inorganic phosphor, for example, based on a rare earth-doped YAG material and/or on a rare earth-doped silicate material. It is also possible that the filling material 6 may contain scattering particles so that the filling material 6 is milky.

At side faces 11*a*, 11*b*, 11*c*, 11*d* of the package body 7, the lead frame parts 21, 22 are exposed. Thus, on each one of the side faces 11*a*, 11*b*, 11*c*, 11*d* there is at least one bottom tie bar 4. The bottom tie bars 4 protrude from a main area of the respective lead frame part 21, 22, in a view onto a bottom side 24 of the frame parts 21, 22, wherein the bottom side 24 is opposite the top side 23.

Preferably, the bottom side 24 is configured for being applied to an external carrier, not shown in FIG. 1, by means of surface mount technology, SMT for short. Next to the respectively assigned side face 11*a*, 11*b*, 11*c*, 11*d*, the bottom tie bars 4 form part of the bottom side 24. The bottom side 24 is preferably part of a bottom face 14 of the semiconductor device 1. Thus, the bottom face 14 consists of the package body 7 and the lead frame parts 21, 22.

As illustrated in FIG. 1, it is possible that the bottom tie bars 4 are of different sizes. For example, the two bottom tie bars 4 at the shorter side faces 11*c*, 11*d* are larger than the bottom tie bars 4 at the two longer side faces 11*a*, 11*b*. Further, according to FIG. 1, the lead frame parts 21, 22 are provided with different numbers of bottom tie bars 4. That is, at the larger, first lead frame part 21, there are three of the bottom tie bars 4, while the smaller, second lead frame part 22 has only one of the bottom tie bars 4. Otherwise, each one of the lead frame parts may carry a plurality of the bottom tie bars 4.

As an option, for example, the smaller, second lead frame part 22 may comprise supporting tie bars 41, wherein such supporting tie bars 41 could also be at the larger, first lead frame part 21. Unlike the bottom tie bars 4, the supporting tie bars 41 do not form part of the bottom side 24, but are distant from the bottom side 24. It is possible that the supporting tie bars 41 are limited to the larger side faces 11*a*, 11*b*. Further, as illustrated in FIG. 1, there can be two of the supporting tie bars 41 per larger side face 11*a*, 11*b*. Seen in top view of the respective side face 11*a*, 11*b*, the supporting tie bars 41 are of rectangular or of approximately rectangular shape.

Unlike the supporting tie bars 41, the bottom tie bars 4 are not shaped rectangularly, seen in top view of the respectively assigned side face 11*a*, 11*b*, 11*c*, 11*d*. Contrary to that, the bottom tie bars 4 are of trapezoidal or of approximately trapezoidal shape, seen in top view of the respectively assigned side face 11*a*, 11*b*, 11*c*, 11*d*.

Accordingly, along a direction perpendicular to the bottom side 24 and in a view onto the respectively assigned side face 11*a*, 11*b*, 11*c*, 11*d*, the bottom tie bars 4 narrow. For example, a minimum width Wmin of the bottom tie bars 4 is present at the top side 23. All the lead frame parts 21, 22, including the supporting tie bars 41 as well as the bottom tie bars 4, preferably have a common top side 23 so that all the sides of the lead frame parts 21, 22, facing away from the bottom face 14 are located in a common plane.

By means of this shape of the bottom tie bars 4, a risk for cracks in the package body 7 during a soldering of the optoelectronic semiconductor device 1 can be decreased. In particular, because of the trapezoidal shape, a principle stress at corners of the bottom tie bars 4, seen in top view of the respectively assigned side face 11*a*, 11*b*, 11*c*, 11*d*, can be reduced by about 20% to 30% compared with a rectangularly shaped tie bar reaching down to the bottom face 14.

As an option, per bottom tie bar 4 there can be one control window 44. However, it is not necessary that every one of the bottom tie bars 4 is provided with one of the control windows 44. The control windows are recesses formed in the respective bottom tie bar 4 from the bottom side 24. The control windows 44 are visible from the respectively assigned side face 11*a*, 11*b*, 11*c*, 11*d*.

Hence, the following applies concerning the shape of the bottom tie bars 4:

- Said shape of the bottom tie bars 4 can minimize a principle stress towards the mold compound, that is, towards the package body 7. Thus, the semiconductor device 1 shows better package robustness than with modified tie bar designs at a Resistance To Solder Heat test, RTSH test for short.
- The described bottom tie bar design can be done at a supplier's site.
- Only minor adaptions to a mounting process of the electric components 51, 52 are required.
- The design changes because of the bottom tie bars 4 described herein, compared with rectangularly shaped modified bottom tie bars, may not be visible to a customer after a soldering of the semiconductor device 1. No changes on the package bottom face 14 are required.
- The bottom tie bars 4 described herein offer a fast solution to resolve package cracks.
- The concept described herein can possibly be applied to packages with thinner package walls.

In FIGS. 2 and 3, an exemplary lead frame sheet 2 with a plurality of lead frame units 20 for semiconductor devices 1, as illustrated in FIG. 1, is shown. Adjacent lead frame units 20 are mechanically connected with each other by means of the bottom tie bars 4 as well as the supporting tie bars 41. Between adjacent lead frame units 20, there is a border line 29 which can also be regarded as a singulation line. That is, the lead frame sheet 2 is configured to be singulated along the border lines 29, for example, by means of sawing or cutting. Accordingly, the border lines 29 cross each one of the bottom tie bars 4 as well as of the supporting tie bars 41.

As shown in FIG. 2, the second lead frame part 22 comprises three of the supporting tie bars 41 and one of the bottom tie bars 4; the first lead frame part 21 comprises one of the supporting tie bars 41 and three of the bottom tie bars 4.

Preferably, the lead frame sheet 2 is produced by half-etching a copper sheet from two sides, that is, is produced by doing a semi-etching from the top side 23 as well as from the bottom side 24. Contour lines 81, 82 for the respective etching steps are illustrated in FIG. 2. Hence, at most places the contour line 81 for the half-etching from the bottom side 24 lies within a contour line 82 for the half-etching from the top side 23, except at the bottom tie bars 4 where the contour line 82 lies within the contour line 81 in order to produce the trapezoidal shape of the bottom tie bars 4, seen in side view, compare FIG. 3.

For example, the minimum width Wmin of the bottom tie bars 4 at the top side 23 is at least 0.3 mm and alternatively or additionally is at most 1.5 mm or is at most 0.8 mm. For example, the minimum width Wmin is about 0.5 mm. For the minimum width Wmin and a maximum width Wmax of the bottom tie bars 4 at the bottom side 24 the following may apply: $0.70 \leq Wmin/Wmax \leq 0.85$. Concerning a thickness Tmax of the lead frame parts 21, 22, the following may optionally apply: $1.5 \leq Wmax/Tmax \leq 4.0$. For example, Tmax is at least 70 μm and/or at most 300 μm. For example, an average side angle from corners of the bottom tie bar 4 at the bottom side 24 and at the top side 23 could be at least 100° and/or at most 130°, and could be about 114°.

According to FIG. 3, the lead frame parts 21, 22 can comprise a first region 401 next to the bottom side 24 and a second region 402 next to the top side 23, seen in cross-section. Each one of the regions 401, 402 may correspond to a depth of one of the semi-etching steps. For example, with a tolerance of at most 10% of the thickness Tmax, the regions 401, 402 have the same thickness. The first region 401 of the bottom tie bar 4 may be of rectangular shape, disregarding the optional control window 44. The second region 402 may be of trapezoidal shape, wherein there can be an axis of symmetry perpendicular to the bottom side 24.

Particularly preferably, there are roundings 25 at the corners of the bottom tie bar 4 facing the package body, seen in side view. For example, the roundings 25 may have radii of curvature of at least 20 μm or of at least 40 μm. Optionally, the roundings 25 directly at the top side 23 have radii of curvature of at least 50 μm or of at least 80 μm and, thus, at the top side 23 the roundings 25 may have larger radii of curvature than at a kink between the first region 401 and the second region 402. For example, the radii of curvature of the roundings 25 are 50 μm at the kink and 100 μm at the top side 23.

As an option, around mounting areas 27 for the electric components 51, 52 there can be in each case a groove 28. For example, the frame-like grooves 28 may be produced by the semi-etching from the top side 23.

Otherwise, the same as to FIG. 1 may also apply to FIGS. 2 and 3, and vice versa.

Figure 5:
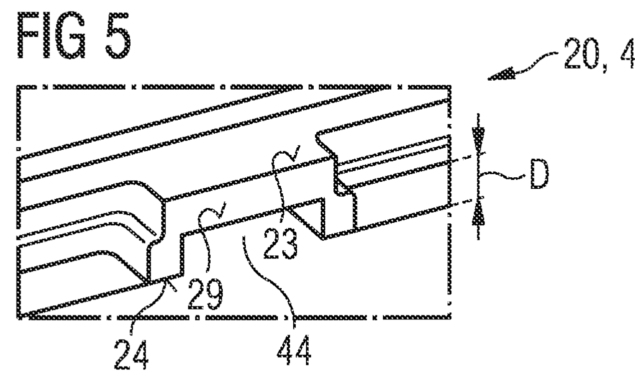
FIG. 5 shows is a schematic perspective view of an exemplary embodiment of a bottom tie bar for optoelectronic semiconductor devices described herein.

In FIGS. 4 and 5, another exemplary embodiment of the bottom tie bar 4 is shown in a side view and in a perspective view, respectively. Here, the first region 401 is again of rectangular or approximately rectangular shape, seen in side view. The second region 402 is of only approximately trapezoidal shape because of manufacturing tolerances during the etching of the lead frame parts 21, 22. Thus, lateral sides of the second region 402 may be curved.

However, particularly preferably there are also the roundings 25 at the top side 23 and at the kink between the regions 401, 402.

It is possible that, because of the curved lateral sides, a minimum width of the bottom tie bar 4 is present not at the top side 23 but within the second region 402. However, because of the roundings 25 at the top side 23, there is preferably a local minimum of the width directly at the top side 23.

Otherwise, the same as to FIGS. 1 to 3 may also apply to FIGS. 4 and 5, and vice versa.

Figure 6:
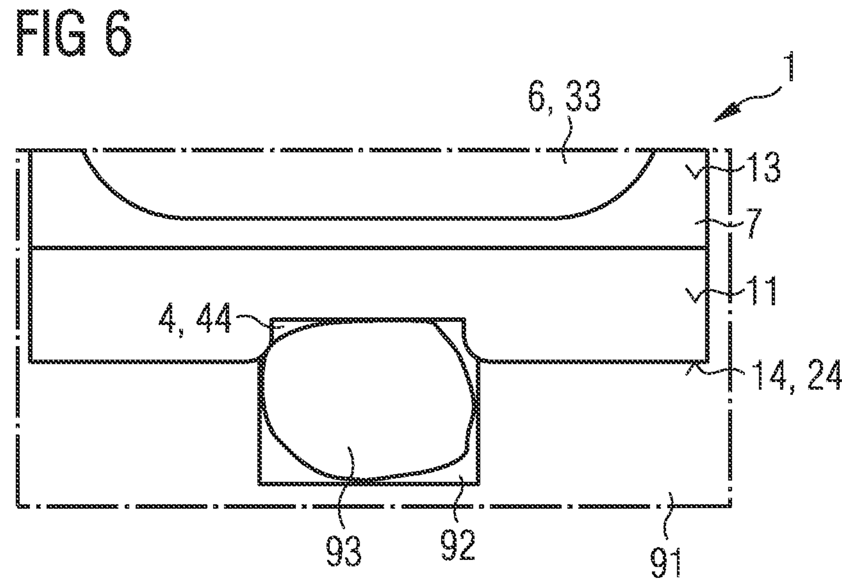
FIG. 6 shows is a schematic perspective view of an exemplary embodiment of an optoelectronic semiconductor device described herein.

In FIG. 6, an exemplary embodiment of the optoelectronic semiconductor device 1 is illustrated, wherein the optoelectronic semiconductor device 1 is soldered onto a solder pad 92 of an external carrier 91 by means of a solder 93. The bottom tie bar 4 is of approximately trapezoidal shape and narrows towards the top face 13. It can be seen that the side face 11 is free of any cracks.

The solder 93 is sucked into the control window 44 so that there is a solder fillet next to the bottom tie bar 4. Accordingly, by means of the control window 44 it can be checked if a soldering has been performed as intended.

Otherwise, the same as to FIGS. 1 to 5 may also apply to FIG. 6, and vice versa.

Figure 7:
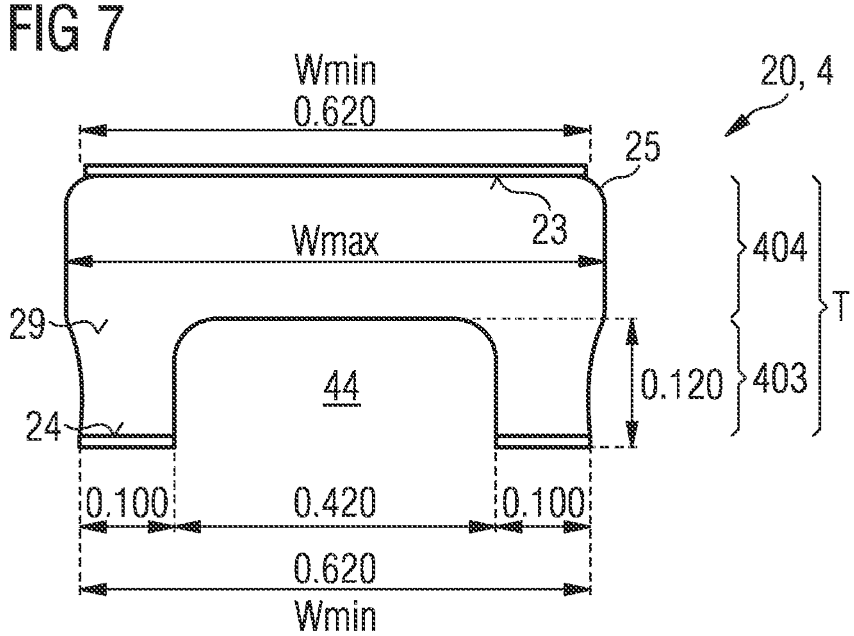
FIG. 7 shows is a schematic sectional view of an exemplary embodiment of an optoelectronic semiconductor device described herein.

In FIG. 7, another exemplary embodiment of the bottom tie bar 4 is illustrated. In this case, the fourth region 404 next to the top side 23 has the maximum width Wmax, and the minimum width Wmin may be present at the bottom side 24 as well as on the top side 23. Accordingly, the minimum width Wmin at the top side 23 may be a local minimum. At the top side 23, particularly preferably there are the roundings 25.

Disregarding the optional control window 44, both the fourth region 404 as well as the third region 403 may be of rectangular shape with rounded corners, wherein the fourth region 404 next to the top side 23 is wider than the third region 403 next to the bottom side 24. Thus, seen in side view and taking into account the optional control window 44, for example, the bottom tie bar 4 may be of π-shape.

In FIG. 7, exemplary dimensions in mm are provided. These dimensions may collectively or in any combination apply, for example, with a tolerance of at most a factor of 3 or of at most a factor of 2 or of at most a factor of 1.4.

Otherwise, the same as to FIGS. 1 to 6 may also apply to FIG. 7, and vice versa.

Figure 8:
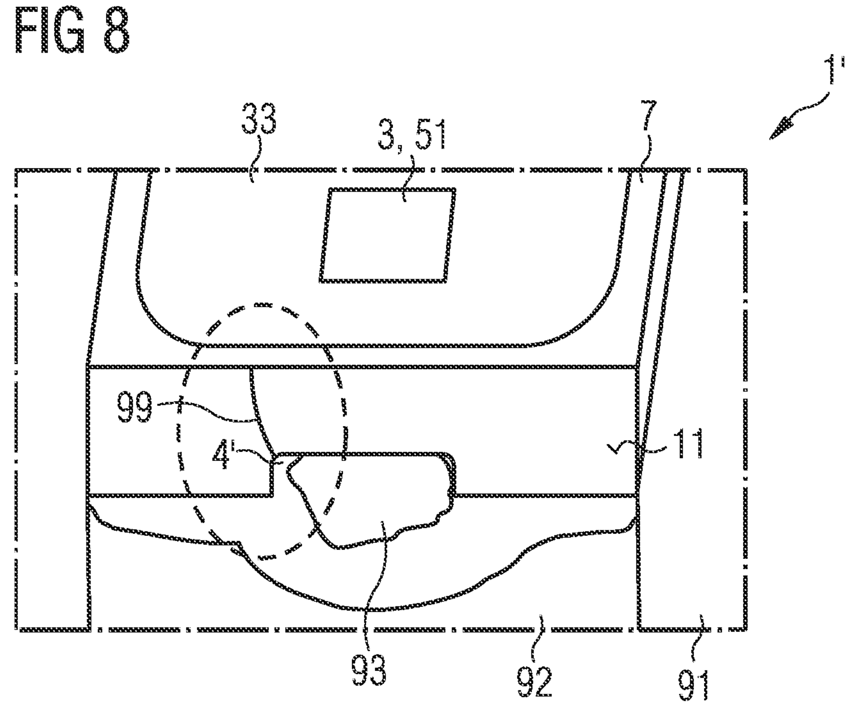
FIGS. 8 and 9 are a schematic perspective view and a schematic side view, respectively, of a modified semiconductor device.
Figure 9:
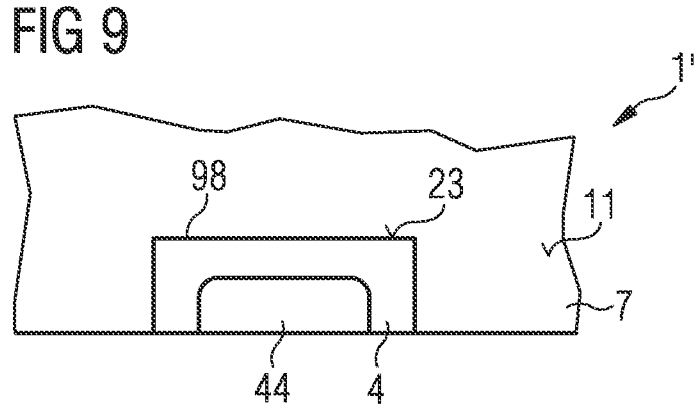

In FIGS. 8 and 9, a modified semiconductor device 1' is illustrated. The semiconductor device 1' comprises a modified bottom tie bar 4' which is of rectangular shape, in particular with no local minimum of the width at the top side 23. Hence, there are approximately rectangular corners 98 at the top side 23. In particular because of these corners 98 and because of the vertical lateral sides, due to the thermal stress during a soldering of the modified semiconductor device 1' there is an increased risk that cracks 99 occur at the side faces 11. By means of the exemplary bottom tie bar 4, such cracks can be avoided efficiently.

The components shown in the figures follow, unless indicated otherwise, exemplarily in the specified sequence directly one on top of the other. Components which are not in contact in the figures are exemplarily spaced apart from one another. If lines are drawn parallel to one another, the corresponding surfaces may be oriented in parallel with one another. Likewise, unless indicated otherwise, the positions of the drawn components relative to one another are correctly reproduced in the figures.

The invention described here is not restricted by the description on the basis of the exemplary embodiments. Rather, the invention encompasses any new feature and also any combination of features, which includes in particular any combination of features in the patent claims, even if this feature or this combination itself is not explicitly specified in the patent claims or exemplary embodiments.

The invention claimed is:

1. A lead frame sheet comprising:

a plurality of device units, each device unit configured for an optoelectronic semiconductor device and comprising at least two metallic lead frame parts configured for being applied to an electric component at a top side and configured for being soldered onto an external carrier at a bottom side opposite the top side, wherein each one of the lead frame parts comprises at least one bottom tie bar connecting adjacent ones of the device units, wherein, at a border line between adjacent ones of the device units, the bottom tie bars form part of the bottom side, and wherein, towards the top side, the bottom tie bars narrow such that each bottom tie bar has a local minimum or a global minimum of a width at the top side and along the border line.

2. An optoelectronic semiconductor device comprising:

at least two metallic lead frame parts-; and a package body made of at least one plastic material and mechanically connecting the at least two lead frame parts, wherein each one of the lead frame parts comprises a bottom tie bar extending to a side face of the semiconductor device, wherein at the side face the bottom tie bars form part of a bottom face of the semiconductor device, wherein each one of the lead frame parts is for an electric component at a top side and for an external carrier at a bottom side opposite the top side, the bottom side being part of the bottom face, and wherein, towards the top side, the bottom tie bars narrow such that each bottom tie bar has a local minimum or a global minimum of a width at the top side and at the side face.

3. The optoelectronic semiconductor device according to claim 2, wherein, seen in plan view of the respective side face, the top side of each one of the bottom tie bars has rounded ends, wherein the package body is thicker than the lead frame parts, and wherein the bottom face is configured for surface mount technology (SMT).

4. The optoelectronic semiconductor device according to claim 2, wherein, seen in plan view of the respective side face, the bottom tie bars are of trapezoidal shape.

5. The optoelectronic semiconductor device according to claim 2, wherein the lead frame parts are etched from the bottom side and from the top side.

6. The optoelectronic semiconductor device according to claim 5, wherein, seen in plan view of the respective side face, the bottom tie bars comprise a first broader region next to the bottom side and a second narrower region next to the top side, in the second region, the tie bars having inclined lateral sides, and wherein a global maximum width of the bottom tie bars is in the first region.

7. The optoelectronic semiconductor device according to claim 6, wherein, seen in plan view of the respective side face, the second region continuously narrows towards the top side so that the bottom tie bars each has the global minimum of its width at the top side and at the side face.

8. The optoelectronic semiconductor device according to claim 5, wherein, seen in plan view of the respective side face, the bottom tie bars comprise a third narrower region next to the bottom side and a fourth broader region next to the top side, and wherein a global maximum width of the bottom tie bars is in the fourth region so that towards the top side the bottom tie bars each has the local minimum of its width at the top side and at the side face.

9. The optoelectronic semiconductor device according to claim 2, wherein each of the bottom tie bars comprises a control window at the side face, wherein the control windows are free of a material of the lead frame parts, wherein each of the control windows reaches to the bottom face, and wherein, seen in plan view of the respective side face, each control window at the bottom face, is located between two sections of the associated bottom tie bar.

10. The optoelectronic semiconductor device according to claim 9, wherein the lead frame parts are etched from the bottom side and from the top side, wherein, seen in plan view of the respective side face, the bottom tie bars comprises a first broader region next to the bottom side and a second narrower region next to the top side, wherein, in the second region, the tie bars have inclined lateral sides, wherein a global maximum width of the bottom tie bars is in the first region, wherein the control windows are located in the first region or in a third region, respectively, and a height of the control windows corresponds to a thickness of the first region or of the third region, respectively, and wherein along a direction perpendicular to the respective side face a length of the control windows is in each case at least 3% and/or at most 20% of an extent of the semiconductor device along the respective direction.

11. The optoelectronic semiconductor device according to claim 2, wherein, seen in plan view of the respective side face, each of the bottom tie bars comprises an axis of mirror symmetry, and wherein, seen in the plan view of the respective side face, a ratio of the width (Wmin) of the bottom tie bars at the top side and the maximum width (Wmax) of each of the bottom tie bars, is $0.70 \leq Wmin/Wmax \leq 0.85$, and wherein a ratio of the maximum width and a thickness (Tmax) of the lead frame parts is: $1.5 \leq Wmax/Tmax \leq 4.0$.

12. The optoelectronic semiconductor device according to claim 2, wherein the bottom tie bars continuously narrow towards the top side and until the top side by at least 5% of a maximum thickness of the respective bottom tie bar at the respective side face.

13. The optoelectronic semiconductor device according to claim 2, further comprising supporting tie bars, wherein each supporting tie bar extends to a respective side face, wherein, seen in plan view of the respective side face, each of the supporting tie bars is completely surrounded by the package body.

14. The optoelectronic semiconductor device according to claim 2, wherein the package body forms a cavity so that the top side of the lead frame parts is partially free of the package body.

15. The optoelectronic semiconductor device according to claim 2, wherein the electric components are an optoelectronic semiconductor chip and an electric connection means, and wherein a groove is formed around the electric components in the respective lead frame part.

16. A lead frame sheet comprising:

a plurality of device units, each device unit being configured for an optoelectronic semiconductor device and comprising at least two metallic lead frame parts configured for being applied to an electric component at a top side and configured for being soldered onto an external carrier at a bottom side opposite the top side, wherein each one of the lead frame parts comprises at least one bottom tie bar connecting adjacent ones of the device units, wherein, at a border line between adjacent ones of the device units, the bottom tie bars form part of the bottom side, and wherein, towards the top side, the bottom tie bars narrow such that each of the bottom tie bars has a global minimum of a width at the top side and along the border line, and wherein the bottom tie bars are of trapezoidal shape, seen in cross-section along the border line, the bottom tie bars are of trapezoidal shape.

* * * * *